(12) United States Patent
Ebara

(10) Patent No.: US 9,240,500 B2
(45) Date of Patent: Jan. 19, 2016

(54) FILM-FORMING MATERIAL

(75) Inventor: Kazuya Ebara, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 104 days.

(21) Appl. No.: 13/990,896

(22) PCT Filed: Dec. 1, 2011

(86) PCT No.: PCT/JP2011/077809
§ 371 (c)(1),
(2), (4) Date: Jul. 10, 2013

(87) PCT Pub. No.: WO2012/074057
PCT Pub. Date: Jun. 7, 2012

(65) Prior Publication Data
US 2013/0284261 A1    Oct. 31, 2013

(30) Foreign Application Priority Data

Dec. 2, 2010  (JP) ................................ 2010-269513

(51) Int. Cl.
| | | |
|---|---|---|
| *H01L 31/02* | (2006.01) | |
| *H01L 31/0216* | (2014.01) | |
| *C08F 12/02* | (2006.01) | |
| *C08F 220/06* | (2006.01) | |
| *C08G 73/06* | (2006.01) | |
| *C08F 212/32* | (2006.01) | |

(52) U.S. Cl.
CPC .......... *H01L 31/02167* (2013.01); *C08F 12/02* (2013.01); *C08F 220/06* (2013.01); *H01L 31/02168* (2013.01); *C08F 212/32* (2013.01); *C08F 2810/20* (2013.01); *C08G 73/0644* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 5,183,722 A | * | 2/1993 | Tsutsumi et al. ............. 430/169 |
| 2003/0171468 A1 | * | 9/2003 | Nishimura et al. ........... 524/261 |
| 2012/0142878 A1 | * | 6/2012 | Osawa et al. ................. 526/261 |

FOREIGN PATENT DOCUMENTS

| | | | |
|---|---|---|---|
| CN | 101512682 A | | 8/2009 |
| CN | 101663600 A | | 3/2010 |
| JP | A-2001-119047 | | 4/2001 |
| JP | A-2001-267597 | | 9/2001 |
| JP | A-2008-168488 | | 7/2008 |
| JP | A-2010-31232 | | 2/2010 |
| JP | A-2010-135652 | | 6/2010 |
| WO | WO 2011/018990 | * | 2/2011 |

OTHER PUBLICATIONS

Ina, N., et al., "Smoothing of PV System Output by Tuning MPPT Control," *Electrical Engineering in Japan*, 2005, pp. 10-17, vol. 152, No. 2.
International Search Report issued in International Application No. PCT/JP2011/077809 on Mar. 13, 2012 (with translation).
Oct. 21, 2014 Office Action issued in Chinese Application No. 201180066626.7

* cited by examiner

*Primary Examiner* — Robert C Boyle
(74) *Attorney, Agent, or Firm* — Oliff PLC

(57) ABSTRACT

There is provided a novel material used for solar cells that can contribute to the improvement in maximum output of solar cells without using the conventional MPPT system. A film-forming material for forming a light-collecting film on a transparent electrode of a solar cell, including an aromatic group-containing organic polymer compound (A) and a cross-linker (B), wherein the film-forming material exhibits an index of refraction of 1.5 to 2.0 at a wavelength of 633 nm and a transmittance of 95% or more with respect to light having a wavelength of 400 nm, and a solar cell obtained by coating a cured film made from the film-forming material on a surface of a transparent electrode.

11 Claims, No Drawings

FILM-FORMING MATERIAL

TECHNICAL FIELD

The present invention relates to a film-forming material used for a solar cell and specifically to a film-forming material used as a light-collecting film by being coated on a surface of a transparent electrode of a solar cell.

BACKGROUND ART

In recent years, solar photovoltaic technology has been significantly developed and various solar cells are commercially distributed. The solar photovoltaic power generation of "converts light energy from the sun into electric energy" has such advantages that (1) the energy source is enormous and is not depleted; (2) the energy source is clean and carbon dioxide is not generated during power generation; and (3) it can allow energy self-sufficiency, and it is technology that can be used not only outside but also in space. The solar cells are roughly classified into the ones containing a silicon semiconductor (crystalline and amorphous (noncrystalline)) as a material and the ones containing a compound semiconductor as a material and cover more various types including those under development.

However, current solar cells can generate only low electricity despite their high production cost, and result in very low cost effectiveness compared to conventional power generation systems. In addition, solar cells after long-term use are observed to have degradation phenomena such as yellowing, separation, whitening and the like of sealing materials due to sunlight and moisture. Therefore currently the solar cells are required to have a long operating life as well as improved maximum power output.

As one of the currently proposed methods for long operating life of a solar cell, measures for preventing degradation have been conferred by adding an ultraviolet absorber, a light stabilizer and an antioxidant to a sealing material.

In order to improve the maximum power output, maximum power point tracking (MPPT) which allows the maximum power output to be obtained by maintaining an optimal operating point according to the variation in the incident light intensity has been widely used (Non-Patent Document 1).

PRIOR ART DOCUMENTS

Patent Documents

Patent Document 1: Japanese Patent Application Publication No. 2010-31232
Patent Document 2: Japanese Patent Application Publication No. 2001-119047

Non-Patent Documents

Non-Patent Document 1: Nobuhiko INA, et al., "Smoothing PV System's Output by Tuning a Characteristic Property of MPPT Control", The Journals of the Institute of Electrical Engineers of Japan. B, 124, No. 3, pp. 455-461 (2004)

SUMMARY OF THE INVENTION

Problems to be Solved by the Invention

The MPPT control system described above may be disadvantageous because, when it is introduced into a solar photovoltaic power generation system of a small scale and independent power system such as for household use, the output power variation of the solar photovoltaic power generation system accompanying the variation in the incident light intensity may affect the frequency of the power system. Thus there is a need for other means that can provide improved maximum output without using the MPPT control system.

With the foregoing in view, it is an object of the present invention to provide a novel material used for solar cells that can contribute to the improvement in maximum output of solar cells for example without using the conventional MPPT control system.

Means for Solving the Problems

The present inventors have carried out extensive studies in order to achieve the above object and, as a result, found that a solar cell having an improved maximum output can be produced by forming a cured film having a high index of refraction and high transparency as a light-collecting film on a transparent electrode of a solar cell unit, thereby completed the present invention.

Thus the present invention relates to, as the first aspect thereof, a film-forming material for forming a light-collecting film on a transparent electrode of a solar cell, including an aromatic group-containing organic polymer compound (A) and a cross-linker (B), wherein the film-forming material exhibits an index of refraction of 1.5 to 2.0 at a wavelength of 633 nm and a transmittance of 95% or more with respect to light having a wavelength of 400 nm.

The present invention relates to, as the second aspect thereof, the film-forming material according to the first aspect, wherein the organic polymer compound (A) is a compound having a carbocyclic group in a side chain.

The present invention relates to, as the third aspect thereof, the film-forming material according to the second aspect, wherein the organic polymer compound (A) is a polymer compound containing at least one structure among the structures of the formulae (1) and (2):

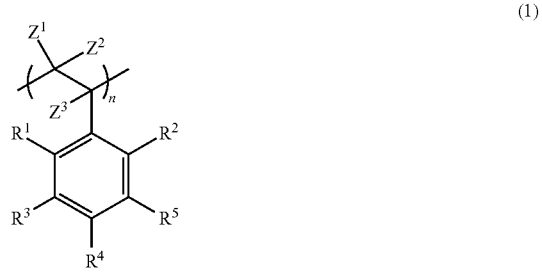

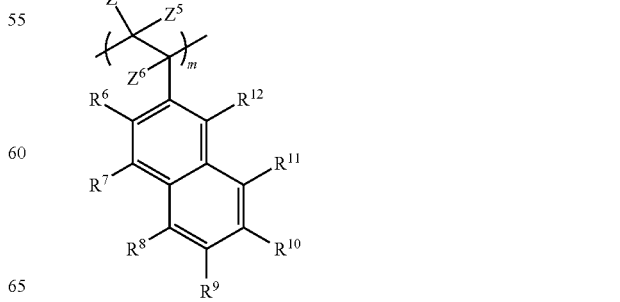

(where $R^1$ to $R^{12}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphonyl group, a sulfonyl group, a phenyl group which is optionally substituted with $W^8$, a naphthyl group which is optionally substituted with $W^8$, a thienyl group which is optionally substituted with $W^8$ or a furyl group which is optionally substituted with $W^8$;

$W^8$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phosphonyl group or a sulfonyl group;

$Z^1$ to $Z^6$ are independently a hydrogen atom, a $C_{1-10}$ alkyl group, a $C_{1-10}$ haloalkyl group, a $C_{1-10}$ alkoxy group or a halogen atom; and n and m are the numbers of repeating unit structures and are independently an integer of 1 or more).

The present invention relates to, as the fourth aspect thereof, the film-forming material according to the third aspect, wherein the organic polymer compound (A) is a polymer compound containing the structure of the formula (1) and/or the structure of the formula (2) at 40 mol % or more relative to all structures contained in the polymer compound and has a weight average molecular weight of 500 or more.

The present invention relates to, as the fifth aspect thereof, the film-forming material according to the first aspect, wherein the component (B) cross-linker is a compound selected from triazine compounds having at least two nitrogen atoms substituted with a hydroxymethyl and/or alkoxymethyl group.

The present invention relates to, as the sixth aspect thereof, the film-forming material according to the fifth aspect, wherein the triazine compounds have an aromatic group.

The present invention relates to, as the seventh aspect thereof, the film-forming material according to the fifth or sixth aspect, wherein the film-forming material contains the component (B) at 50 to 400 parts by mass relative to 100 parts by mass of the organic polymer compound (A).

The present invention relates to, as the eighth aspect thereof, the film-forming material according to the seventh aspect, further including as the component (C) an acid-generating compound.

The present invention relates to, as the ninth aspect thereof, the film-forming material according to the eighth aspect, wherein the film-forming material contains the component (C) at 10 parts by mass or less relative to 100 parts by mass of the organic polymer compound (A).

The present invention relates to, as the tenth aspect thereof, the film-forming material according to the seventh aspect, further including as the component (D) an acid compound having pKa of less than 4.

The present invention relates to, as the eleventh aspect thereof, the film-forming material according to the tenth aspect, wherein the film-forming material contains the component (D) at 10 parts by mass or less relative to 100 parts by mass of the organic polymer compound (A).

The present invention relates to, as the twelfth aspect thereof, the film-forming material according to any one of the first to eleventh aspects, which further includes a solvent (E) and is in the form of varnish.

The present invention relates to, as the thirteenth aspect thereof, a cured film obtained with the film-forming material according to any one of the first to twelfth aspects.

The present invention relates to, as the fourteenth aspect thereof, a solar cell having a cured film obtained with the film-forming material according to any one of the first to twelfth aspects, with the cured film being coated on a surface of a transparent electrode.

Effects of the Invention

The film-forming material of the present invention can form a cured film which is transparent and has a high index of refraction by simply applying the film-forming material and allowing it to cure on a transparent electrode of a solar cell unit.

The solar cell including the cured film obtained with the film-forming material of the present invention, with the cured film being coated on a surface of a transparent electrode, can improve maximum output power.

MODES FOR CARRYING OUT THE INVENTION

The present invention relates to a material for forming a light-collecting film on a transparent electrode of a solar cell. The film-forming material contains an aromatic group-containing organic polymer compound (A) and a cross-linker (B) and exhibit an index of refraction of 1.5 to 2.0 at a wavelength of 633 nm and a transmittance of 95% or more with respect to light having a wavelength of 400 nm.

<Component (A): Organic Polymer Compound>

The organic polymer compound (A) used for the present invention is specifically a compound having a carbocyclic group in a side chain. The carbocyclic group herein refers to a cyclic group which does not contain a hetero atom such as a nitrogen atom or a carbon atom in a ring, and includes a monocyclic group such as a benzene ring and the like and a carbon condensed ring group such as a naphthalene ring, an anthracene ring and the like.

Preferred is a polymer compound containing at least one structure among the structures of the following formulae (1) and (2). The polymer compound having a triazine skeleton or a fluorene skeleton is used.

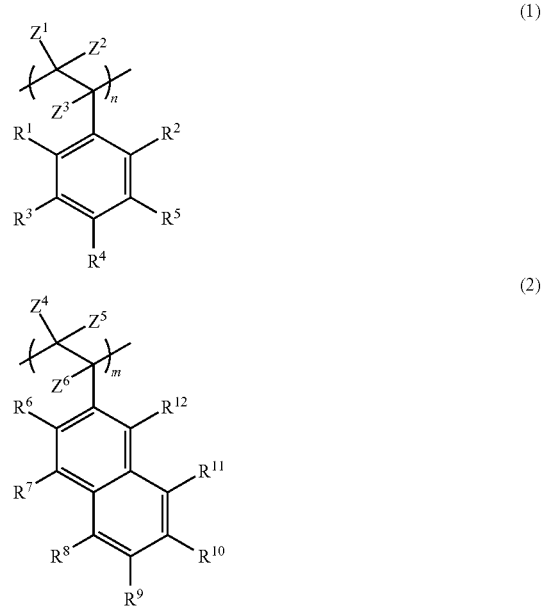

In the above formulae, $R^1$ to $R^{12}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphoryl group, a sulfonyl group, a phenyl group which is optionally substituted with $W^8$, a naphthyl group which is optionally substituted with $W^8$, a thienyl group which is optionally substituted with $W^8$ or a furyl group which is optionally substituted with $W^8$.

$W^8$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phosphonyl group or a sulfonyl group.

$Z^1$ to $Z^6$ are independently a hydrogen atom, a $C_{1-10}$ alkyl group, a $C_{1-10}$ haloalkyl group, a $C_{1-10}$ alkoxy group or a halogen atom.

Further, n and m are the numbers of repeating unit structures and are independently an integer of 1 or more.

In the above formulae, examples of the $C_{1-10}$ alkyl group include methyl, ethyl, n-propyl, isopropyl, n-butyl, isobutyl, sec-butyl, tert-butyl, n-pentyl, isopentyl, n-hexyl, cyclohexyl and the like groups.

Examples of the $C_{1-10}$ haloalkyl group include the above $C_{1-10}$ alkyl group which is substituted with at least one halogen atom selected from a group consisting of a fluorine atom, a chlorine atom, a bromine atom and an iodine atom.

Examples of the $C_{1-10}$ alkoxy group include methoxy, ethoxy, n-propoxy, isopropoxy, n-butoxy, isobutoxy, sec-butoxy, tert-butoxy, n-pentyloxy, isopentyloxy, n-hexyloxy, cyclohexyloxy and the like groups.

Examples of the halogen atom include a fluorine atom, a chlorine atom, a bromine atom and an iodine atom.

Specific examples of the polymer compound having the structure of the formula (1) or (2) include, but not limited to, polymer compounds formed with monomers such as styrene, 2-fluorostyrene, 2-chlorostyrene, 2-bromostyrene, 2-iodostyrene, 2-hydroxy carbonyl styrene, 2-cyanostyrene, 2-phenylstyrene, 2-aminostyrene, 2-nitrostyrene, 2-methoxystyrene, 2-ethoxystyrene, 2-propoxystyrene, 2-methylstyrene, 2-ethylstyrene, 2-hydroxyphosphoryl styrene, 3-fluorostyrene, 3-chlorostyrene, 3-bromostyrene, 3-iodostyrene, 3-hydroxy carbonyl styrene, 3-cyanostyrene, 3-phenylstyrene, 3-aminostyrene, 3-nitrostyrene, 3-methoxystyrene, 3-ethoxystyrene, 3-propoxystyrene, 3-methylstyrene, 3-ethylstyrene, 3-hydroxyphosphoryl styrene, 4-fluorostyrene, 4-chlorostyrene, 4-bromostyrene, 4-iodostyrene, 4-hydroxy carbonyl styrene, 4-cyanostyrene, 4-phenylstyrene, 4-aminostyrene, 4-nitrostyrene, 4-methoxystyrene, 4-ethoxystyrene, 4-propoxystyrene, 4-methylstyrene, 4-ethylstyrene, 4-hydroxyphosphoryl styrene, 2,4-difluorostyrene, 2,4-dichlorostyrene, 2,4-dibromostyrene, 2,4-diiodostyrene, 2,4,5-trifluorostyrene, 2,4,5-trichlorostyrene, 2,4,5-tribromostyrene, 2,4,5-triiodostyrene, vinylnaphthalene and the like.

The organic polymer compound (A) desirably has the weight average molecular weight in terms of polystyrene of 500 or more, preferably from 500 to 40,000 in view of applicability.

In the polymer compound, the structure of the formula (1) and/or formula (2), i.e. the structure of the formula (1) or the structure of the formula (2) or both structures of the formulae (1) and (2), if both are contained, accounts for 40 mol % or more, preferably 45 mol % or more of the all structures contained in the polymer compound.

<Component (B): Cross-Linker>

The film-forming material of the present invention contains, as a cross-linker, a component (B): a triazine compound having at least two nitrogen atoms substituted with a hydroxymethyl and/or alkoxymethyl group.

Examples of the triazine compound having at least two nitrogen atoms substituted with a hydroxymethyl and/or alkoxymethyl group include melamine compounds having nitrogen atoms substituted either with a hydroxymethyl group or an alkoxymethyl group or with both of the foregoings and benzoguanamine compounds having nitrogen atoms substituted either with a hydroxymethyl hydroxymethyl group or an alkoxymethyl group or with both of the foregoings.

The melamine and benzoguanamine compounds having nitrogen atoms substituted with a hydroxymethyl group can be obtained by, for example, reaction of melamine/benzoguanamine with formalin in boiled water for hydroxymethylation. The melamine and benzoguanamine compounds having nitrogen atoms substituted with an alkoxymethyl group can be obtained by reaction of the hydroxymethyl-substituted melamine/benzoguanamine compounds with an alcohol such as methanol, ethanol, isopropyl alcohol, normal hexanol and the like.

The melamine and benzoguanamine compounds substituted with a hydroxymethyl and/or alkoxymethyl group are commercially available. Examples of the melamine compound include CYMEL 300, CYMEL 303, CYMEL 325 and CYMEL 725 (all from Nihon Cytec Industries Inc.), NIKALAC MW-30M, NIKALAC MW-30, NIKALAC MW-30HM, NIKALAC MW-390 and NIKALAC MW-100LM (all from Sanwa Chemical Co., Ltd.) (all products are methoxymethylated melamine compounds); CYMEL 370 and CYMEL 701 (all from Nihon Cytec Industries Inc.) (all products are methylated methoxymethylated melamine compounds); CYMEL 266, CYMEL 285 and CYMEL 212 (all from Nihon Cytec Industries Inc.) (all products are methoxymethylated butoxymethylated melamine compounds); CYMEL 272 and CYMEL 202 (all from Nihon Cytec Industries Inc.) (all products are methylated methoxymethylated melamine compounds); CYMEL 238 from Nihon Cytec Industries Inc. (methoxymethylated isobutoxymethylated melamine compound); and MY COAT 506 from Nihon Cytec Industries Inc. (butoxymethylated melamine compound). Examples for the benzoguanamine compound include CYMEL 1123 from Nihon Cytec Industries Inc. (methoxymethylated ethoxymethylated benzoguanamine compound); CYMEL 1123-10 and MY COAT 30 (all from Nihon Cytec Industries Inc.) (all products are methoxymethylated butoxymethylated benzoguanamine compounds); MY COAT 105 and MY COAT 106 (all from Nihon Cytec Industries Inc.) (all products are methoxymethylated benzoguanamine compounds); CYMEL 1128 from Nihon Cytec Industries Inc. (butoxymethylated benzoguanamine compound); and MY COAT 102 from Nihon Cytec Industries Inc. (methylated methoxymethylated benzoguanamine compound).

The compound (B) is used at the proportion of 50 to 4,000 parts by mass, more preferably 50 to 200 parts by mass in view of the storage stability relative to 100 parts by mass of the organic polymer compound (A).

<Component (C): Acid-Generating Compound and Compound (D): Acid Compound Having pKa of Less than 4>

The film-forming material of the present invention can contain, as a compound (C) an acid-generating compound (hereinafter also simply referred to as an acid-generating material) and/or, as a compound (D) an acid compound having pKa of less than 4. In the present invention, the acid dissociation constant pKa corresponds to $pKa = \log_{10} Ka$ wherein an acid dissociation constant (Ka) is obtained when an acidic compound is dissolved in aqueous solution.

The acid-generating material and the acid compound can respectively be one type or a combination of two or more types. The acid-generating material and the acid compound can be used in combination.

Examples of the acid-generating material include acid-generating materials which generate acid with heat or light such as 2,4,4,6-tetrabromocyclohexadienone, benzoin tosylate, 2-nitrobenzyl tosylate, 2,4-dinitrobenzyl p-trifluoromethylbenzenesulfonate, phenyl-bis(trichloromethyl)-s-triazine, N-hydroxysuccinimide trifluoromethansulfonate and the like. Also mentioned are iodonium salt-containing acid-generating materials such as diphenyliodonium hexafluorophosphate, diphenyliodonium trifluoromethanesulfonate, bis(4-tert-butylphenyl)iodonium trifluoromethanesulfonate and the like; and sulfonium salt-containing acid-generating materials such as triphenylsulfonium hexafluoroantimonate, triphenylsulfonium trifluoromethanesulfonate and the like.

Examples of the acid compound include sulfonic acid compounds such as p-toluenesulfonic acid (also referred to as tosylic acid), trifluoromethanesulfonic acid, pyridinium p-toluenesulfonate and the like and carboxylic acid compounds such as sulfosalicylic acid, trifluoroacetic acid, fumaric acid, maleic acid and the like.

The content of the acid-generating material or the acid compound in the film-forming material of the present invention among solid matters is for example 0.01 to 10 mass %, preferably 0.1 to 5 mass % in view of the properties of the resulting film and more preferably 0.2 to 3 mass % in view of the storage stability.

<Other Components>

The film-forming material of the present invention can contain other conventional additives, for example a surfactant and the like.

Examples of the surfactant include nonionic surfactants including polyoxyethylene alkyl ethers such as polyoxyethylene lauryl ether, polyoxyethylene stearyl ether, polyoxyethylene cetyl ether, polyoxyethylene oleyl ether and the like; polyoxyethylene alkyl allyl ethers such as polyoxyethylene octyl phenol ether, polyoxyethylene nonyl phenol ether and the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate and the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate and the like; fluorine surfactants including EFTOP EF301, EF303 and EF352 (all from JEMCO Inc. (former Tohkem Products Corporation)), MEGAFAC F171, F173 and R-30 (all from DIC Corporation (former Dainippon Ink & Chemicals Inc.)), FLUORAD FC430 and FC431 (all from Sumitomo 3M Limited); ASAHI GUARD AG710, SURFLON S-382, SC101, SC102, SC103, SC104, SC105 and SC106 (all from Asahi Glass Co., Ltd.) and FTERGENT 220P (Neos Co., Ltd.); an organosiloxane polymer KP341 (Shin-Etsu Chemical Co., Ltd.) and the like.

The amount of these surfactants is, among all components of the film-forming material of the present invention, usually 0.2 mass % or less, preferably 0.1 mass % or less. These surfactants can be used alone or in combination with two or more surfactants.

<Component (E): Solvent>

The film-forming material of the present invention is optionally in the form of varnish by adding a solvent for solubilization.

The solvent which can be used includes, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methyl-2-pyrolidone, γ-butyrolactone and the like. These solvents can be used alone or in combination with two or more solvents.

The film-forming material of the present invention contains solid matters of for example 0.5 to 50 mass %, 1 to 30 mass % or 1 to 25 mass %. The term "solid matters" herein refers to all components in the film-forming material except for the solvent component.

<Solar Cell>

The film-forming material of the present invention is applicable as a material of various silicon solar cells which have been conventionally proposed.

A solar cell generally includes a solar cell unit having a transparent electrode (surface electrode)/a photoelectric conversion layer/a back electrode; a panel material for mounting the solar cell unit, namely a sealing material for sealing the cell module such as an ethylene-vinyl acetate copolymer resin (EVA) and the like; a cover glass (strengthened glass) for protecting the cell module and the sealing material; and a cover film (back sheet).

In the present invention, each component of the solar cell, namely the solar cell unit (the back electrode, the photoelectric conversion layer and the transparent electrode), the sealing material, the cover glass and the cover film as well as various electrode covering materials can be the ones which have been conventionally proposed.

Practically, the film-forming material of the present invention is applied on a surface of the transparent electrode of the solar cell unit to form an electrode coating film. The solar cell is then produced by laminating the strengthened glass, the sealing material, the solar cell unit (electrode coating film/transparent electrode/photoelectric conversion layer/back electrode), the sealing material and the back sheet in this order.

Examples

The present invention is further described in detail hereinafter by referring to Examples which do not limit the present invention.

Abbreviations Used in Examples

Abbreviations used in the following Examples have the meanings as follows.
<Monomers, Cross-Linkers>
CYMEL 1123: a melamine-based compound (methoxymethylated benzoguanamine compound) from Nihon Cytec Industries Inc.;

VN: 2-vinylnaphthalene;
MAA: methacrylic acid;
Pst: polystyrene; and
TAG-2689: an acid-generating material from King Industries, Inc.
<Solvents>
PGMEA: propylene glycol monomethyl ether acetate; and
PGME: propylene glycol monomethyl ether.
<Surfactant>
FTERGENT 220P: from Neos Co., Ltd.
<Solar Cell Unit>
A 125-mm rectangular crystalline silicon cell unit from Motech Industries, Inc.
<Sealing Material>
A sealing material from Sanvic Inc.
<Tab>
A 1.5-mm PV-ribbon wire from Marusho Co., Ltd.
<Back Sheet>
A back sheet from MA Packaging Co., Ltd.
<Strengthened Glass>
A strengthened glass from Shinkyowa Co., Ltd.

[Measurement of Weight Average Molecular Weight]

Polymers obtained according to the following synthesis examples were measured for the weight average molecular weight (hereinafter abbreviated as Mw) using a GPC instrument from JASCO Corporation (with Shodex (registered trademark) columns KF803L and KF805L) by flowing dimethylformamide as an elution solvent in the columns (column temperature: 50° C.) at a flow rate of 1 ml/min to elute the polymers. Mw is expressed in terms of polystyrene.

[Sample Application]

Film-forming materials were applied on transparent electrodes of the cell units using a spray applicator from YD Mechatro Solutions Inc.

[Measurement of Index of Refraction]

The index of refraction was measured with a high speed spectroscopic ellipsometer M-2000 from J.A. Woollam JAPAN Co., Inc.

[Preparation of Module]

A module was prepared using a laminator LM-50×50-S from NPC Incorporated. On the strengthened glass, the sealing material, the cell unit, the sealing material and the back sheet were mounted in this order and laminated at 130° C. for 20 minutes.

[IV Measurement]

For IV measurement, a solar simulator YSS-150 from Yamashita Denso Corporation was used. The module was irradiated with light for 6 times at 25° C. and the measured IV data were averaged.

Synthesis Examples

Synthesis of Polymer A1 and Preparation of A1 Solution (VN:MAA=45:55)

To a 3 L three-neck flask, 200.0 g (1.30 moles) of VN, 133.3 g (1.55 moles) of MAA, 666.7 g of a solvent PGME and 16.7 g of an initiator azobisbutyronitrile were charged and dissolved, and then added dropwise over 2 hours to 266.7 g of PGME heated under nitrogen atmosphere and maintained at 80° C. The reaction solution was cooled and added to an excess amount of an aqueous methanol solution (methanol concentration: 50 mass %) to re-precipitate a polymer which was then dried with heat to give a polymer A1. The resulting polymer had the weight average molecular weight Mw of 6,200. The resulting polymer A1 was re-dissolved in propylene glycol monomethyl ether to obtain a polymer A1 solution (solid matter concentration: 30.0 mass %).

<Preparation for Solutions of Polymers A2 and A3>

A polystyrene having the weight average molecular weight Mw of 2,000 was used as a polymer A2. Pst (20.0 g) was dissolved in 80.0 g of PGMEA to obtain a polymer A2 solution.

Similarly, a polystyrene having Mw of 35,000 was used as a polymer A3; 20.0 g of this Pst was dissolved in 80.0 g of PGMEA to obtain a polymer A3 solution.

Synthesis of Film-Forming Materials

Examples 1 to 4

According to the compositions shown in the following Table 2, the component (A): polymer solution, the component (B): cross-linker, the component (C): acid-generating compound or the component (D): acid compound and the component (E): solvent were mixed according to Table 1 and stirred at a room temperature (approximately 25° C.) for over 3 hours to obtain a homogeneous solution so that a film-forming material in the form of varnish was obtained.

TABLE 1

| | Composition of film-forming materials | | | | | |
|---|---|---|---|---|---|---|
| | Component (A) (g) | Component (B) (g) | Component (C) (g) | Component (D) (g) | Solvent (E) (g) | Surfactant (g) |
| Example 1 | A1 6 | CYMEL 1123 1.8 | — | — | PGME 7.45 | 220P 0.0002 |
| Example 2 | A1 6 | CYMEL 1123 1.8 | — | Tosylic acid 0.02 | PGMEA 7.45 | 220P 0.0002 |
| Example 3 | A2 6 | CYMEL 1123 1.8 | TAG-2689 0.12 | — | PGMEA 7.39 | 220P 0.0002 |
| Example 4 | A3 6 | CYMEL 1123 1.8 | TAG-2689 0.06 | — | PGMEA 7.39 | 220P 0.0002 |

Examples 5 to 9 and Comparative Example

Preparation of Modules and IV Property Evaluation

The obtained film-forming materials in the form of varnish of Examples 1 to 4 were applied on cell units using the spray device and cured prior to the formation of modules. As Comparative Example, a module that the film-forming material was not applied was prepared in the similar manner. The film-forming materials used, the curing conditions and results of measured film thickness and index of refraction are shown in Table 2.

The film thickness was measured on a sample obtained after application and curing under the same conditions as described above for the cell units on a Si substrate using a contact-type film thickness analyzer (Dektak 3).

The index of refraction was measured at 633 nm on a sample obtained after application and curing under the same conditions as described above for the cell units on a Si substrate.

The current-voltage (1-V) measurement was conducted using the prepared cell units of Examples and Comparative Example. For each of the obtained short-circuit current (A): Isc, open voltage (V): Voc and maximum power output (W): Pmax, when the measured value for the cell unit of Comparative Example (without film-forming material) was considered as 100%, the relative values (%) of Isc, Voc and Pmax for the cell units of each Example were determined (see the following equations). The obtained results are shown in Table 2.

$Isc\ (\%)=100\times Example\ X(Isc\ value)/Comparative\ Example(Isc\ value)$ $Voc(\%)=100\times Example\ X(Voc\ value)/Comparative\ Example(Voc\ value)$ $Pmax\ (\%)=100\times Example\ X(Pmax\ value)/Comparative\ Example(Pmax\ value)$

TABLE 2

Results of element property evaluation

| | Film-forming material | Curing conditions | Film thickness (μm) | Index of refraction | Isc (%) | Voc (%) | Pmax (%) |
|---|---|---|---|---|---|---|---|
| Example 5 | Example 1 | 180° C./ 10 min. | 1.00 | 1.61 | 100 | 100 | 102 |
| Example 6 | Example 1 | 180° C./ 10 min. | 0.50 | 1.61 | 100 | 100 | 104 |
| Example 7 | Example 2 | 180° C./ 30 min. | 1.00 | 1.62 | 100 | 100 | 101 |
| Example 8 | Example 3 | 180° C./ 60 min. | 1.00 | 1.60 | 100 | 100 | 102 |
| Example 9 | Example 4 | 180° C./ 10 min. | 1.00 | 1.62 | 100 | 100 | 102 |
| Comparative Example | — | — | — | — | 100 | 100 | 100 |

[Evaluation Results]

As shown in Table 2, it is apparent from the results of Examples 5 to 9 that the film-forming materials of the present invention allow increase in the maximum power output (Pmax) by 1 to 4%.

The invention claimed is:

1. A film-forming material for forming a light-collecting film on a transparent electrode of a solar cell, the film-forming material comprising:
an aromatic group-containing organic polymer compound (A);
a cross-linker (B) selected from triazine compounds having at least two nitrogen atoms substituted with a hydroxymethyl and/or alkoxymethyl group;
an acid-generating compound (C); and
an acid compound (D) having pKa of less that 4, wherein the film-forming material exhibits an index of refraction of 1.5 to 2.0 at a wavelength of 633 nm and a transmittance of 95% or more with respect to light having a wavelength of 400 nm, and
the film-forming material contains the cross-linker (B) at 50 to 400 parts by mass relative to 100 parts by mass of the organic polymer compound (A).

2. The film-forming material according to claim 1, wherein the organic polymer compound (A) is a compound having a carbocyclic group in a side chain.

3. The film-forming material according to claim 2, wherein the organic polymer compound (A) is a polymer compound containing at least one structure of the structures of formulae (1) and (2):

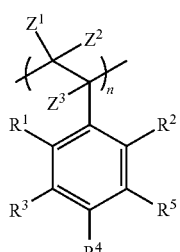

(1)

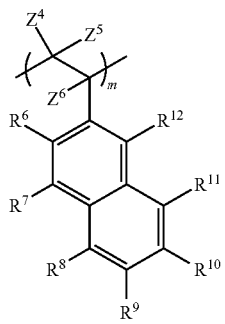

(2)

(where $R^1$ to $R^{12}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphonyl group, a sulfonyl group, a phenyl group which is optionally substituted with $W^8$, a naphthyl group which is optionally substituted with $W^8$, a thienyl group which is optionally substituted with $W^8$ or a furyl group which is optionally substituted with $W^8$;

$W^8$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phosphonyl group or a sulfonyl group;

$Z^1$ to $Z^6$ are independently a hydrogen atom, a $C_{1-10}$ alkyl group, a $C_{1-10}$ haloalkyl group, a $C_{1-10}$ alkoxy group or a halogen atom; and n and m are the numbers of repeating unit structures and are independently an integer of 1 or more).

4. The film-forming material according to claim 3, wherein the organic polymer compound (A) is a polymer compound containing the structure of the formula (1) and/or the structure of the formula (2) at 40 mol % or more relative to all structures contained in the polymer compound and having a weight average molecular weight of 500 or more.

5. The film-forming material according to claim 1, wherein the triazine compounds are compounds having an aromatic group.

6. The film-forming material according to claim 1, wherein the film-forming material contains the acid-generating compound (C) at 10 parts by mass or less relative to 100 parts by mass of the organic polymer compound (A).

7. The film-forming material according to claim 1, wherein the film-forming material contains the acid compound (D) at 10 parts by mass or less relative to 100 parts by mass of the organic polymer compound (A).

8. The film-forming material according to claim 1, wherein the film-forming material further comprises a solvent (E) and is in the form of varnish.

9. A cured film obtained with the film-forming material according to claim 1.

10. A solar cell obtained by coating a cured film made from the film-forming material according to claim 1 on a surface of a transparent electrode.

11. The film-forming material according to claim 5, wherein the triazine compounds are benzoguanamine compounds.

* * * * *